(12) United States Patent
Zhang et al.

(10) Patent No.: US 12,094,875 B2
(45) Date of Patent: Sep. 17, 2024

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Xin Zhang, Suzhou (CN); Jianjian Sheng, Suzhou (CN); Junyuan Lv, Suzhou (CN); Zhenzhe Li, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 331 days.

(21) Appl. No.: 17/616,677

(22) PCT Filed: Oct. 27, 2021

(86) PCT No.: PCT/CN2021/126722
§ 371 (c)(1),
(2) Date: Dec. 6, 2021

(87) PCT Pub. No.: WO2023/070372
PCT Pub. Date: May 4, 2023

(65) Prior Publication Data
US 2023/0352476 A1  Nov. 2, 2023

(51) Int. Cl.
*H01L 27/06* (2006.01)
*H01L 21/8252* (2006.01)
*H01L 23/522* (2006.01)

(52) U.S. Cl.
CPC ...... *H01L 27/0688* (2013.01); *H01L 21/8252* (2013.01); *H01L 23/5223* (2013.01); *H01L 23/5226* (2013.01)

(58) Field of Classification Search
CPC ............ H01L 27/0688; H01L 21/8252; H01L 23/5223; H01L 23/5226
(Continued)

(56) References Cited

U.S. PATENT DOCUMENTS 10,224,401 B2 * 3/2019 Mishra ................ H01L 29/4236
2013/0200387 A1   8/2013 Lee et al.
2017/0200818 A1   7/2017 Suzuki et al.

FOREIGN PATENT DOCUMENTS

CN      1950945 A    4/2007
CN    105990417 A   10/2016
(Continued)

OTHER PUBLICATIONS

International Search Report and Written Opinion of the corresponding PCT application No. PCT/CN2021/126722 mailed on Jul. 6, 2022.

*Primary Examiner* — Tu-Tu V Ho
(74) *Attorney, Agent, or Firm* — Li & Cai Intellectual Property (USA) Office

(57) ABSTRACT

A nitride-based semiconductor device includes a first nitride-based semiconductor layer, a second nitride-based semiconductor layer, a source electrode and a drain electrode, a gate structure, a first field plate, and a second field plate. The second nitride-based semiconductor layer is disposed on the first nitride-based semiconductor layer. The source electrode and the drain electrode are disposed above the second nitride-based semiconductor layer. The gate structure is disposed above the second nitride-based semiconductor layer. The first field plate is disposed over the gate structure and is electrically coupled with the source electrode and the drain electrode. The second field plate is disposed over the gate structure and is electrically coupled with the gate structure. The first field plate and the second field plate are parallel with each other. A top surface of the
(Continued)

first field plate faces a bottom surface of the second field plate to overlap with each other.

20 Claims, 8 Drawing Sheets

(58) Field of Classification Search
USPC .......................................................... 257/183
See application file for complete search history.

(56) References Cited

FOREIGN PATENT DOCUMENTS

| | | |
|---|---|---|
| CN | 113016074 A | 6/2021 |
| CN | 113228297 A | 8/2021 |

* cited by examiner

NITRIDE-BASED SEMICONDUCTOR DEVICE AND METHOD FOR MANUFACTURING THE SAME

FIELD OF THE DISCLOSURE

The present invention generally relates to a nitride-based semiconductor device. More specifically, the present invention relates to a III-nitride-based semiconductor device having a MIM capacitor and a HEMT capacitor integrated into a single structure.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

At present, there are two main capacitor designs, including HEMT capacitors and MIM (metal-to-metal) capacitors. These two types of capacitors have their own characteristics. Generally, the circuit design can apply different capacitor types according to the desired requirements. Therefore, there is a need for a structure with a HEMT capacitor and a MIM capacitor integrated into one.

SUMMARY OF THE DISCLOSURE

In accordance with one aspect of the present disclosure, a nitride-based semiconductor device is provided. The nitride-based semiconductor device includes a first nitride-based semiconductor layer, a second nitride-based semiconductor layer, a source electrode and a drain electrode, a gate structure, a first field plate, and a second field plate. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate structure is disposed above the second nitride-based semiconductor layer and is located between the source electrode and the drain electrode. The first field plate is disposed over the gate structure and is electrically coupled with the source electrode and the drain electrode. The second field plate is disposed over the gate structure and is electrically coupled with the gate structure. The first field plate and the second field plate are parallel with each other. A top surface of the first field plate faces a bottom surface of the second field plate to overlap with each other over the gate structure.

In accordance with one aspect of the present disclosure, a method for manufacturing a semiconductor device is provided. The method includes steps as follows. A second nitride-based semiconductor layer is formed on a first nitride-based semiconductor layer. A source electrode, a drain electrode, and a gate structure are formed over the second nitride-based semiconductor layer. A first field plate is formed over the gate structure. A second field plate is formed over the first field plate. The gate structure and the second field plate are connected. The source electrode and the drain electrode are electrically connected to the first field plate.

In accordance with one aspect of the present disclosure, a nitride-based semiconductor device is provided. The nitride-based semiconductor device includes a first nitride-based semiconductor layer, a second nitride-based semiconductor layer, a source electrode and a drain electrode, a gate structure, a first field plate, a second field plate, and a gate contact. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer and overlaps with an active region of the second nitride-based semiconductor layer. The gate structure is disposed above the second nitride-based semiconductor layer and is located between the source electrode and the drain electrode and extends from the active region to the outside of the active region. The first field plate and the second field plate are disposed over the gate structure and are parallel with each other. The gate contact extends upward from the gate structure and beyond the first field plate to make contact with the second field plate. An interface between the gate structure and the gate contact is outside the active region.

Based on the configuration above, a HEMT capacitor and a MIM capacitor in parallel can be integrated into a semiconductor device, which is advantageous to improvement of space utilization. Accordingly, the capacitance per unit volume or per area in the semiconductor device increases. Such the electrical connection manner is highly compatible with HEMT devices, thereby adapting to HEMT devices.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1A:
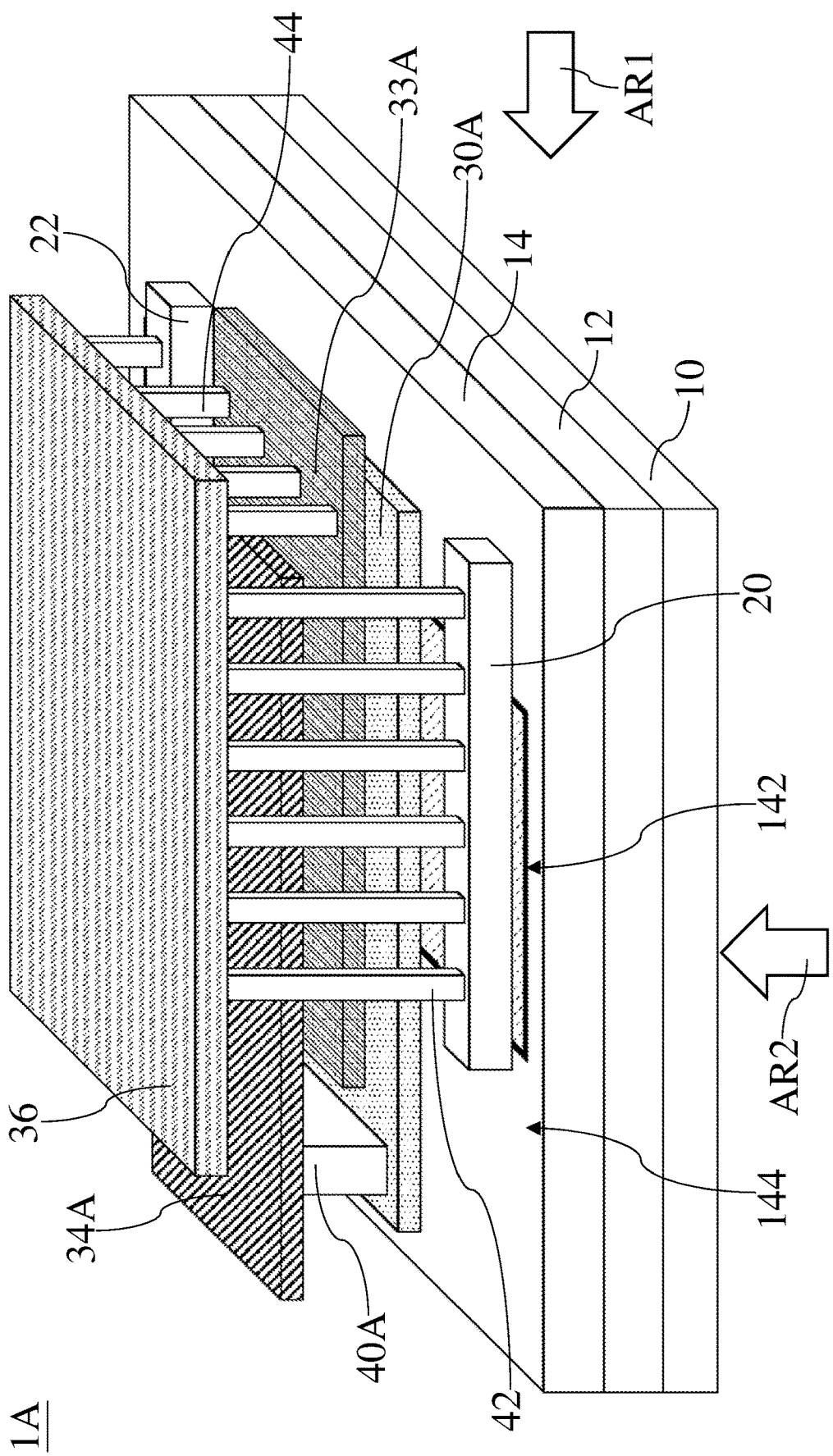
FIG. 1A is a schematic perspective view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "on," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
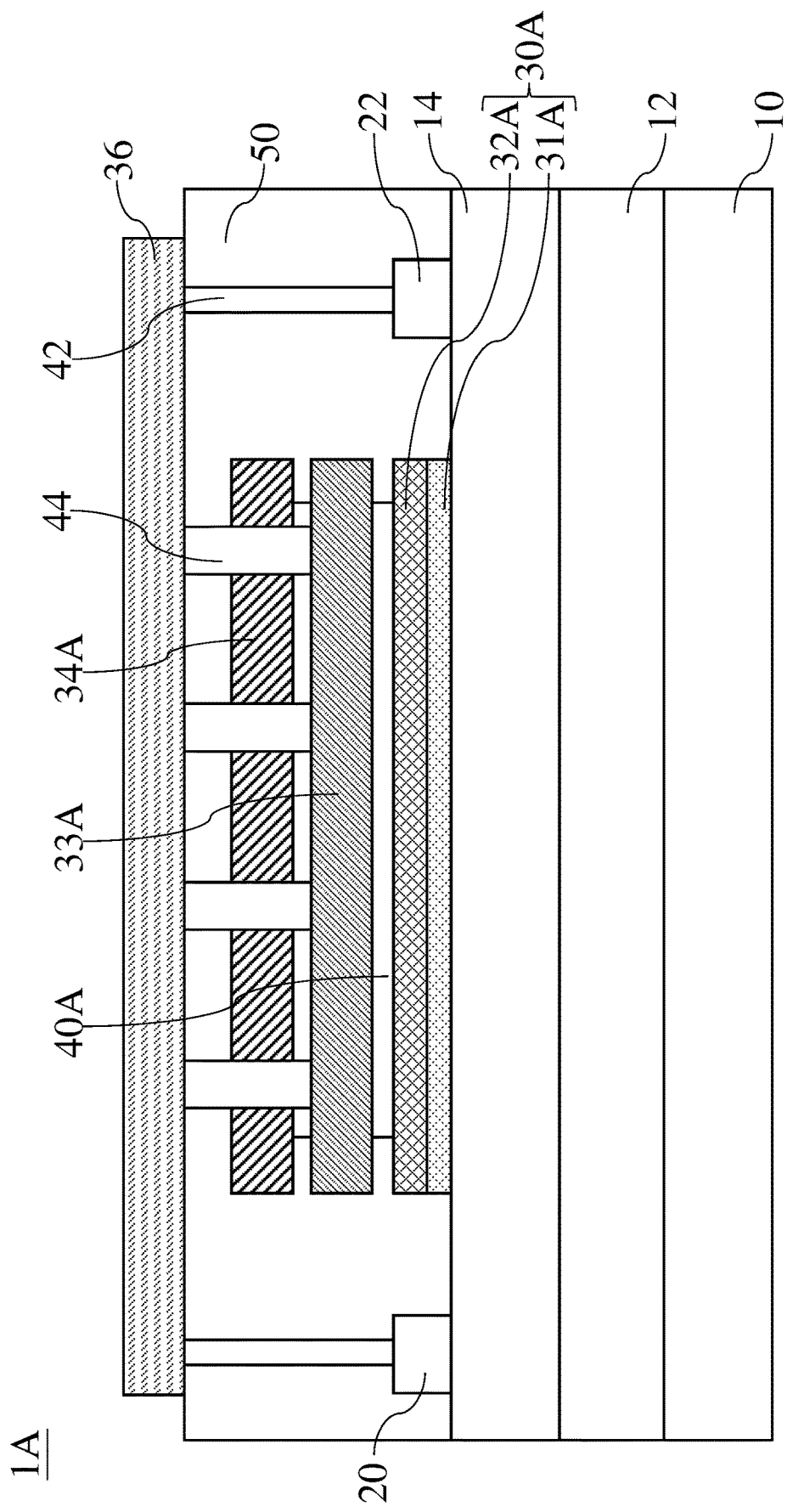
FIG. 1B is a schematic drawing of the semiconductor device of FIG. 1A viewed along an arrow according to some embodiments of the present disclosure.
Figure 1C:
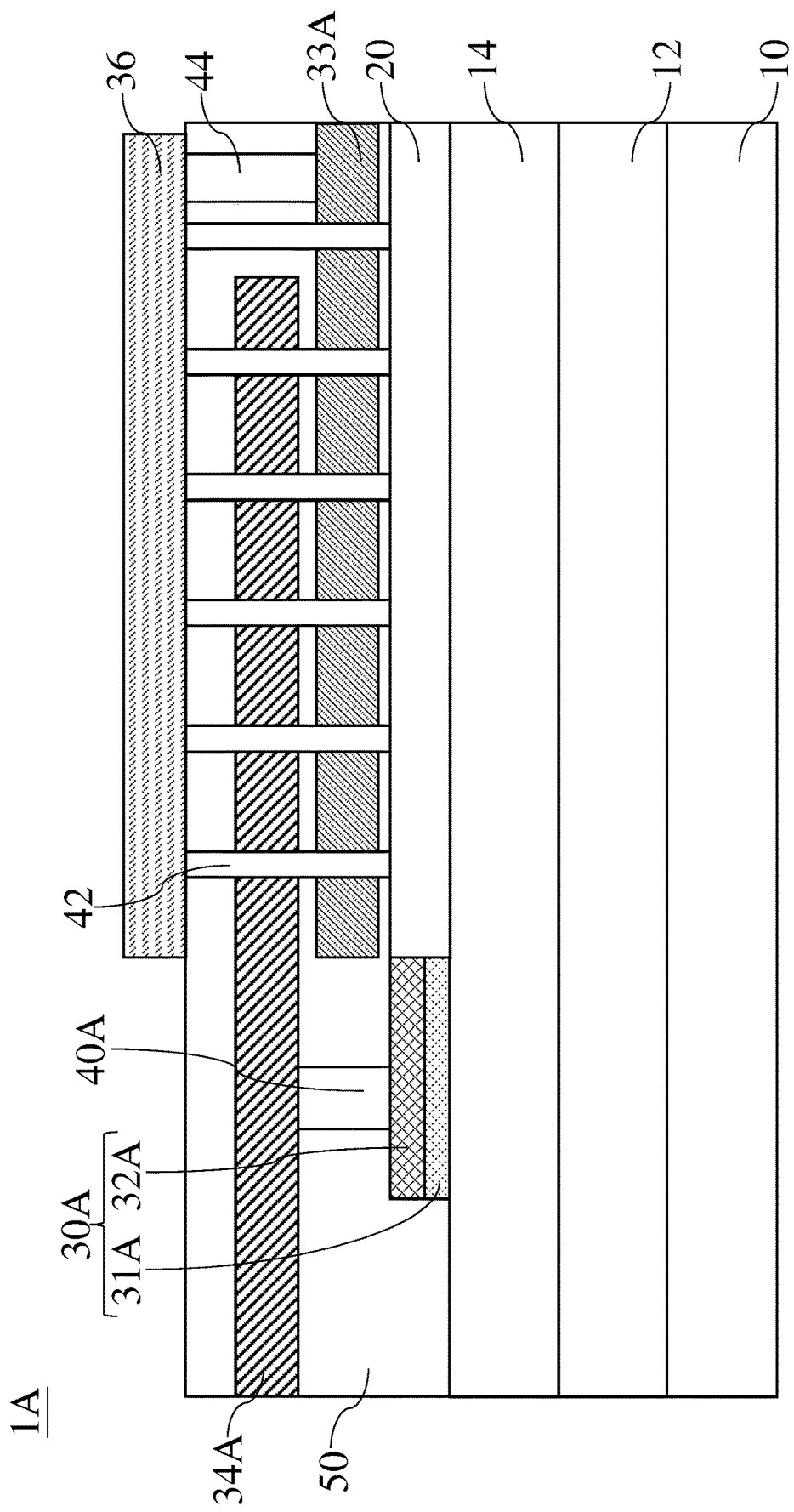
FIG. 1C is a schematic drawing of the semiconductor device 1A of FIG. 1A viewed along an arrow according to some embodiments of the present disclosure.

FIG. 1A is a schematic perspective view of a semiconductor device 1A according to some embodiments of the present disclosure. FIG. 1B is a schematic drawing of the semiconductor device 1A of FIG. 1A viewed along an arrow AR1 according to some embodiments of the present disclosure. FIG. 1C is a schematic drawing of the semiconductor device 1A of FIG. 1A viewed along an arrow AR2 according to some embodiments of the present disclosure.

The semiconductor device 1A includes a substrate 10, nitride-based semiconductor layers 12 and 14, electrodes 20 and 22, a gate structure 30A, field plates 33A and 34A, a conductive layer 36, a gate contact 40A, contact vias 42 and 44, and a dielectric layer 50.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

In some embodiments, the substrate 10 can include a buffer layer. The buffer layer can be in contact with the nitride-based semiconductor layer 12. The buffer layer can be configured to reduce lattice and thermal mismatches between the substrate 10 and the nitride-based semiconductor layer 12, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlGaN, InAlGaN, or combinations thereof.

In some embodiments, the substrate 10 may further include a nucleation layer (not shown). The nucleation layer may be formed beneath the buffer layer. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 12 is disposed on/over/above the buffer layer. The nitride-based semiconductor layer 14 is disposed on/over/above the nitride-based semiconductor layer 12. The exemplary materials of the nitride-based semiconductor layer 12 can include, for example but are not limited to, nitrides or group III-V compounds, such as GaN, AlN, InN, $In_xAl_yGa_{(1-x-y)}N$ where $x+y \leq 1$, $Al_xGa_{(1-x)}N$ where $x \leq 1$. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 12 and 14 are selected such that the nitride-based semiconductor layer 14 has a bandgap (i.e., forbidden band width) greater/higher than a bandgap of the nitride-based semiconductor layer 12, which causes electron affinities thereof different from each other and forms a heterojunction therebetween. For example, when the nitride-based semiconductor layer 12 is an undoped GaN layer having a bandgap of approximately 3.4 eV, and the nitride-based semiconductor layer 14 can be selected as an AlGaN layer having bandgap of approximately 4.0 eV. As such, the nitride-based semiconductor layers 12 and 14 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

The nitride-based semiconductor layers 12 and 14 can collectively have an active region 142. The active region 142 can act as a region that allows carrier to flow therethrough via the 2DEG region. In this regard, the boundary of the active region 142 can be defined by the different with respect to the resistivity. For example, the nitride-based semiconductor layers 12 and 14 can collectively have another region 144 enclosing/surrounding the active region 142 and having a resistivity higher than that of the active region 142. Such the region 144 can be referred to as an isolation region. As such, carriers will tend to flow within the active region 142 via the 2DEG region rather than the isolation region.

The electrodes 20 and 22 can be disposed on/over/above the nitride-based semiconductor layer 14. The electrodes 20 and 22 can be in contact with the nitride-based semiconductor layer 14. The electrodes 20 and 22 can be disposed directly on/over/above the active region 142 of the nitride-based semiconductor layer 14. The electrodes 20 and 22 can be in contact with the active region 142 of the nitride-based semiconductor layer 14. The electrodes 20 and 22 can be arranged to overlap with the active region 142 of the nitride-based semiconductor layer 14. The electrodes 20 and 22 can extend inside the active region 142 of the nitride-based semiconductor layer 14 to the region 144.

In some embodiments, the electrode 20 can serve as a source electrode. In some embodiments, the electrode 20 can serve as a drain electrode. In some embodiments, the electrode 22 can serve as a source electrode. In some embodiments, the electrode 22 can serve as a drain electrode. The role of the electrodes 20 and 22 depends on the device design.

In some embodiments, the electrodes 20 and 22 can include, for example but are not limited to, metals, alloys, doped semiconductor materials (such as doped crystalline silicon), compounds such as silicides and nitrides, other conductor materials, or combinations thereof. The exemplary materials of the electrodes 20 and 22 can include, for example but are not limited to, Ti, AlSi, TiN, or combinations thereof. The electrodes 20 and 22 may be a single layer, or plural layers of the same or different composition. In some embodiments, the electrodes 20 and 22 form ohmic contacts with the nitride-based semiconductor layer 14. The ohmic contacts can be achieved by applying Ti, Al, or other suitable materials to the electrodes 20 and 22. In some embodiments, each of the electrodes 20 and 22 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The gate structure 30A can be disposed on/over/above the nitride-based semiconductor layer 14. The gate structure 30A can be in contact with the nitride-based semiconductor layer 14. The gate structure 30A can be disposed directly on/over/above the active region 142 of the nitride-based semiconductor layer 14. The gate structure 30A can be in contact with the active region 142 of the nitride-based semiconductor layer 14. The gate structure 30A can be arranged to overlap with the active region 142 of the nitride-based semiconductor layer 14. The gate structure 30A can extend from the active region 142 to the outside of the active region 142. The gate structure 30A can extend inside the active region 142 of the nitride-based semiconductor layer 14 to the region 144.

The gate structure 30A can include a doped nitride-based semiconductor layer 31A and a gate electrode 32A, as shown in FIG. 1B and FIG. 1C. The gate electrode 32A is staked on the doped nitride-based semiconductor layer 31A.

The doped nitride-based semiconductor layer 31A can be disposed on/over/above the nitride-based semiconductor layer 14. The doped nitride-based semiconductor layer 31A can be in contact with the nitride-based semiconductor layer 14. The doped nitride-based semiconductor layer 31A can be disposed between the electrodes 20 and 22.

The gate electrode 32A can be disposed on/over/above the doped nitride-based semiconductor layer 31A. The gate electrode 32A can be in contact with the doped nitride-based semiconductor layer 31A, such that the doped nitride-based semiconductor layer 31A can be disposed/sandwiched between the gate electrode 32A and the nitride-based semiconductor layer 14. The gate electrode 32A can be disposed between the electrodes 20 and 22.

The field plates 33A and 34A are disposed over the gate structure 30A. The field plate 33A is located between the gate structure 30A and the field plate 34A. The field plates 33A and 34A are located in a region between the electrodes 20 and 22.

The field plates 33A and 34A are parallel with each other. More specifically, a top surface of the field plate 33A faces a bottom surface of the field plate 34A to overlap with each other over the gate structure 30A. In some embodiments, the top surface of the field plate 33A and the bottom surface of the field plate 34A overlap with each other over the active region 142. That is, the overlapped areas of the field plates 33A and 34A have vertical projections on the nitride-based semiconductor layer 14, in which the vertical projections overlap with the active region 142.

In some embodiments, the field plate 33A is parallel with the doped nitride-based semiconductor layer 31A and the gate electrode 32A. In some embodiments, the field plate 34A is parallel with the doped nitride-based semiconductor layer 31A and the gate electrode 32A. The parallel configuration is advantageous to construct a capacitor.

The field plates 33A and 34A are configured to change an electric field distribution over the nitride-based semiconductor layer 14 and affect breakdown voltage of the semiconductor device 1A. The field plates 33A and 34A can suppress the electric field distribution in desired regions and to reduce its peak value. The exemplary materials of the field plates 33A and 34A can include, for example but are not limited to, metals, alloys, doped semiconductor materials (such as doped crystalline silicon), other suitable conductor materials, or combinations thereof.

The conductive layer 36 is disposed over the field plates 33A and 34A. The field plate 34A is located between the field plate 33A and the conductive layer 36. The conductive layer 36 is located in a region between the electrodes 20 and 22. The conductive layer 36 can be formed as being parallel with the field plates 33A and 34A. The exemplary materials of the conductive layer 36 can include, for example but are not limited to, metals, alloys, doped semiconductor materials (such as doped crystalline silicon), other suitable conductor materials, or combinations thereof.

The dielectric layer 50 is disposed over the nitride-based semiconductor layer 14. The dielectric layer 50 can be formed by multiple dielectric layers merged with each other. The exemplary of the dielectric layer 50 can include, for example but is not limited to, dielectric material. For example, the dielectric material can include $SiN_x$ (e.g., $Si_3N_4$), $SiO_x$, $Si_3N_4$, SiON, SiC, SiBN, SiCBN, oxides, nitrides, oxides, nitrides, plasma-enhanced oxide (PEOX), tetraethoxysilane normal abbreviation (TEOS), or combinations thereof.

The dielectric material of the dielectric layer 50 can fill into a region between different layers. For example, the dielectric material of the dielectric layer 50 can fill into a region between the electrode 20 and the gate electrode 31 of the gate structure 30A. The dielectric material of the dielectric layer 50 can fill into a region between the electrode 22 and the gate electrode 31 of the gate structure 30A. The dielectric material of the dielectric layer 50 can fill into a region between the gate electrode 31 of the gate structure 30A and the field plate 33A. The dielectric material of the dielectric layer 50 can fill into a region between the field plates 33A and 34A. The dielectric material of the dielectric layer 50 can fill into a region between the field plate 34A and the conductive layer 36.

The electrodes 20, 22, the gate electrode 32A, the field plates 33A and 34A, and the conductive layer 36 can constitute at least two capacitors integrated into the structure. The present disclosure provides an electrical connection such that these layers can constitute a HEMT capacitor and a metal-to-metal (MIM) capacitor integrated in parallel with each other to the structure. In this regard, one of the key issues is how the electrical connection among the layers is routed. By a proper electrical connection, the layers can directly constitute a HEMT capacitor and a MIM capacitor, and thus an extra reticle design for it is unnecessary. That is, the electrical connection configuration of the present disclosure is compatible with kinds of HEMT devices. The electrical connection among the layers can be achieved by the gate contact 40A and the contact vias 42 and 44, as stated in the following.

The gate contact 40A is disposed over the nitride-based semiconductor layer 14 and the gate structure 30A. The gate contact 40A can extend between the gate electrode 32A of the gate structure 30A and the field plate 34A. More specifically, the gate contact 40A can extend upward from the gate electrode 32A of the gate structure 30A to make contact with the field plate 34A. The gate contact 40A can form an interface with the field plate 34A in a position higher than the field plate 33A. The top end of the gate contact 40A is higher than or beyond the field plate 33A.

The gate contact 40A horizontally overlaps with the field plate 33A. In the present disclosure, the phrase "a first element horizontally overlaps a second elements" means that the first and second elements are located at the same level of height but are spaced away from each other. Accordingly, the gate contact 40A is free from contact with the field plate 33A. By such the connection, the gate electrode 32A can be electrically coupled with the field plate 34A through the gate contact 40A.

Furthermore, since the formation of the gate contact 40A involves with an etching process performed on the dielectric layer 50, the location of the gate contact 40A needs to be considered. In this regard, during the manufacturing process of the semiconductor device 1A, an etching process may be performed to removing a portion of the dielectric layer 50 for forming an opening exposing the gate structure 30A. The opening of the dielectric layer 50 is to be filled with the gate contact 40A.

Figure 1D:
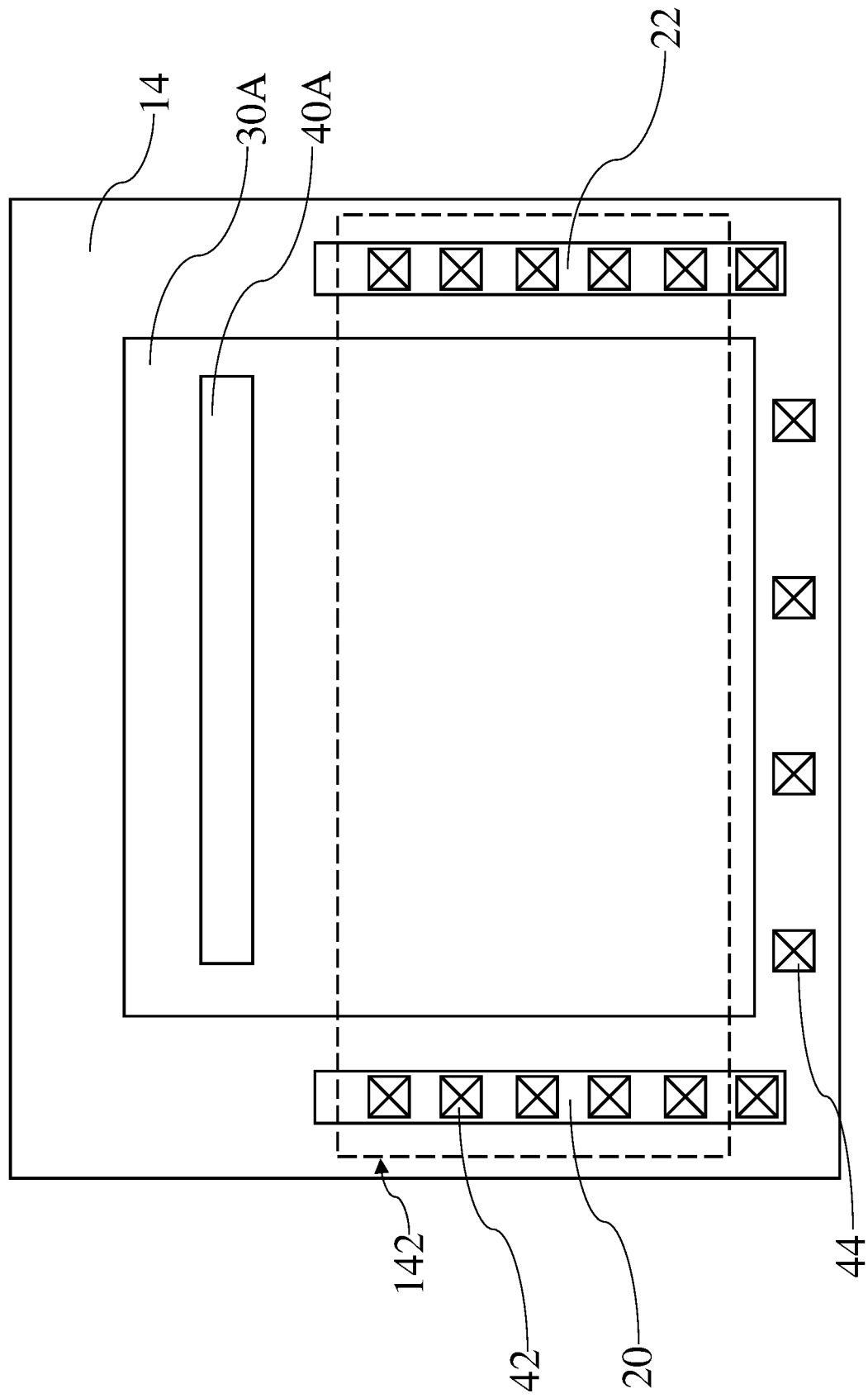
FIG. 1D depicts a layout over the nitride-based semiconductor layer of the semiconductor device according to some embodiments of the present disclosure.

To illustrate, FIG. 1D depicts a layout over the nitride-based semiconductor layer 14 of the semiconductor device 1A according to some embodiments of the present disclosure. As shown in FIG. 1D, the gate structure 30A and the electrodes 20 and 22 are arranged to overlap with the active region 142. The gate structure 30A has a portion out of the active region 142 and over the electrodes 20 and 22 in the layout, which means such the portion of the gate structure 30A is closer to a top boundary of the nitride-based semiconductor layer 14 than the electrodes 20 and 22.

The gate contact 40A can be formed within the boundary of the portion of the gate structure 30A and out of the boundary of the active region 142. Accordingly, a vertical projection of the gate contact 40A on the nitride-based semiconductor layer 14 is outside of the active region 142. The interface between the gate structure 30A and the gate contact 40A is outside the active region 142. In some embodiments, the gate contact 40A can formed at a region free from being directly between the electrodes 20 and 22.

As such, even overetching occurs during the formation of the gate contact 40A, the performance of the semiconductor device 1A is almost free from being affected.

More specifically, when overetching occurs at a dielectric layer, morphology of the dielectric layer may change so layers to be formed over the deformed dielectric layer will not comply with the original device design. For example, field plates formed over the deformed dielectric layer will not comply with the original device design so modulation to an electrical field by the field plates may be invalid.

In this regard, since the gate contact 40A is formed at a region away from the active region 142, even the dielectric layer 50 gets deformed, the deformed portion of the dielectric layer 50 would be away from the active region 142 as well, so as to avoid the field plates (e.g., the field plates 33A and 34A) mismatching the original device design.

Referring back to FIGS. 1A, 1B, and 1C, the contact vias 42 can extend upward from the electrodes 20 and 22 to the conductive layer 36. The contact vias 42 can extend upward to make contact with the conductive layer 36 so as to form an interface with the conductive layer 36 in a position higher than the field plate 34A. The contact vias 42 horizontally overlaps with the field plates 33A and 34A. The contact vias 42 are free from contact with the field plate 33A. By such the connection, the contact vias 42 can be electrically coupled with the conductive layer 36. The electrodes 20 and 22 and the conductive layer 36 are electrically coupled with each other through the contact vias 42.

The contact vias 44 can extend upward from the field plate 33A to the conductive layer 36. The contact vias 44 can extend upward to make contact with the conductive layer 36 so as to form an interface with the conductive layer 36 in a position higher than the field plate 34A. The contact vias 44 horizontally overlaps with the field plate 34A. The contact vias 44 are free from contact with the field plate 34A. By such the connection, the contact vias 44 can be electrically coupled with the conductive layer 36. The field plate 33A and the conductive layer 36 are electrically coupled with each other through the contact vias 44. Accordingly, the electrodes 20 and 22 can be electrically coupled with the field plate 33A through the conductive layer 36 and the vias 42 and 44.

As such, the gate electrode 32A of the gate structure 30A and the field plate 34A can have the same electric potential; and the electrodes 20 and 22 and the field plate 33A can have the same electric potential which is allowed to differ from the one applied to the gate electrode 32A of the gate structure 30A and the field plate 34A. Therefore, when different electric potentials are applied, more than one capacitor is constructed in the structure. In some embodiment, the different electric potentials can be applied to the corresponding layer by at least one external power source.

Figure 1E:
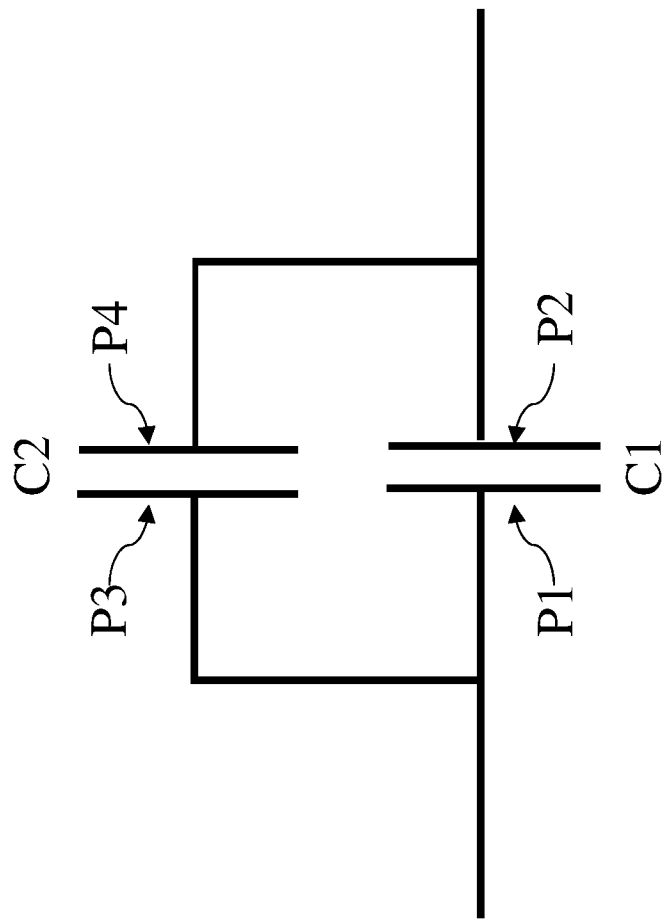
FIG. 1E depicts an equivalent circuit diagram of the semiconductor device according to some embodiments of the present disclosure.

FIG. 1E depicts an equivalent circuit diagram of the semiconductor device 1A according to some embodiments of the present disclosure. As shown in FIGS. 1A and 1E, the electrodes 20 and 22 and the gate electrode 32A of the gate structure 30A can constitute a HEMT capacitor C1. The gate electrode 32A of the gate structure 30A can collectively serve as a plate P1 of the HEMT capacitor C1. The electrodes 20 and 22 can serve as a plate P2 of the HEMT capacitor C1.

The gate electrode 32A of the gate structure 30A, the field plates 33A and 34A, and the conductive layer 36 can constitute a MIM capacitor C2. The gate electrode 32A of the gate structure 30A and the field plate 34A can collectively serve as a plate P3 of the MIM capacitor C2. The field plate 33A and the conductive layer 36 can serve as a plate P4 of the MIM capacitor C2.

The plate P1 of the HEMT capacitor C1 and the plate P3 of the MIM capacitor C2 are connected to the same node, since the gate electrode 32A of the gate structure 30A can serve as the plate P1 of the HEMT capacitor C1 and the plate P3 of the MIM capacitor C2. The plate P2 of the HEMT capacitor C1 and the plate P4 of the MIM capacitor C2 are connected to the same node, since the electrodes 20 and 22 are electrically coupled with the field plate 33A and the conductive layer 36. Therefore, the HEMT capacitor C1 and the MIM capacitor C2 are connected in parallel.

The HEMT capacitor C1 and the MIM capacitor C2 can be integrated into the same structure, which is advantageous to improvement of space utilization. That is, the capacitance per unit volume or per area increases. Furthermore, with respect to the HEMT capacitor C1, the linearity of the HEMT capacitor is improved C1 since the auxiliary by the MIM capacitor C2. In this regard, capacitance of a HEMT capacitor is easy to change in response to a voltage change on its plate, which differs from character of a MIM capacitor. With respect to such the change, a configuration as a HEMT capacitor and a MIM capacitor are in parallel (e.g., the HEMT capacitor C1 and the MIM capacitor C2 in parallel) is more stable than only a HEMT capacitor. Accordingly, by the configuration of the HEMT capacitor C1 and the MIM capacitor C2 in parallel, the MIM capacitor C2 can cure shortcomings of the HEMT capacitor C1, and such the configuration can be achieved by the field plates 33A and 34A so no need to introduce extra conductive plate into the structure.

Referring back to FIG. 1A, to manufacture the semiconductor device 1A, the nitride-based semiconductor layers 12 and 14 can be formed on the substrate 10. The formation of the nitride-based semiconductor layers 12 and 14 can be achieved by using deposition techniques. For example, the deposition techniques may include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

The electrodes 20 and 22 and the gate structure 30A are formed over the nitride-based semiconductor layer 14 at least by using deposition techniques. In some embodiments, the formation of the electrodes 20 and 22 and the gate structure 30A may include at least one patterning process.

The field plates 33A and 34A can be formed over the gate structure 30A. Prior to the formation of the field plate 34A, the gate contact 40A is formed to make contact with the gate structure 30A. The field plate 34A can be deposited over the gate contact 40A so the formed field plate 34A can cover the gate contact 40A and so the gate contact 40A can connect the formed field plate 34A to the gate structure 30A.

Among the formation of the different layers as afore mentioned, at least one dielectric material can be deposited to form a dielectric layer. For example, after the formation of the field plate 34A, a dielectric material can be deposited to form a dielectric layer covering the field plate 34A.

Thereafter, some portions of the dielectric layer 50 can be removed, and then the contact vias 42 and 44 are formed to be surrounded by the dielectric layer 50. After the formation of the contact vias 42 and 44, the conductive layer 36 is formed to cover the contact vias 42 and 44 and make contact with the contact vias 42 and 44. As afore-described, the electrodes 20 and 22 can be electrically connected to the field plate 33A through the conductive layer 36 and the contact vias 42 and 44.

Figure 2:
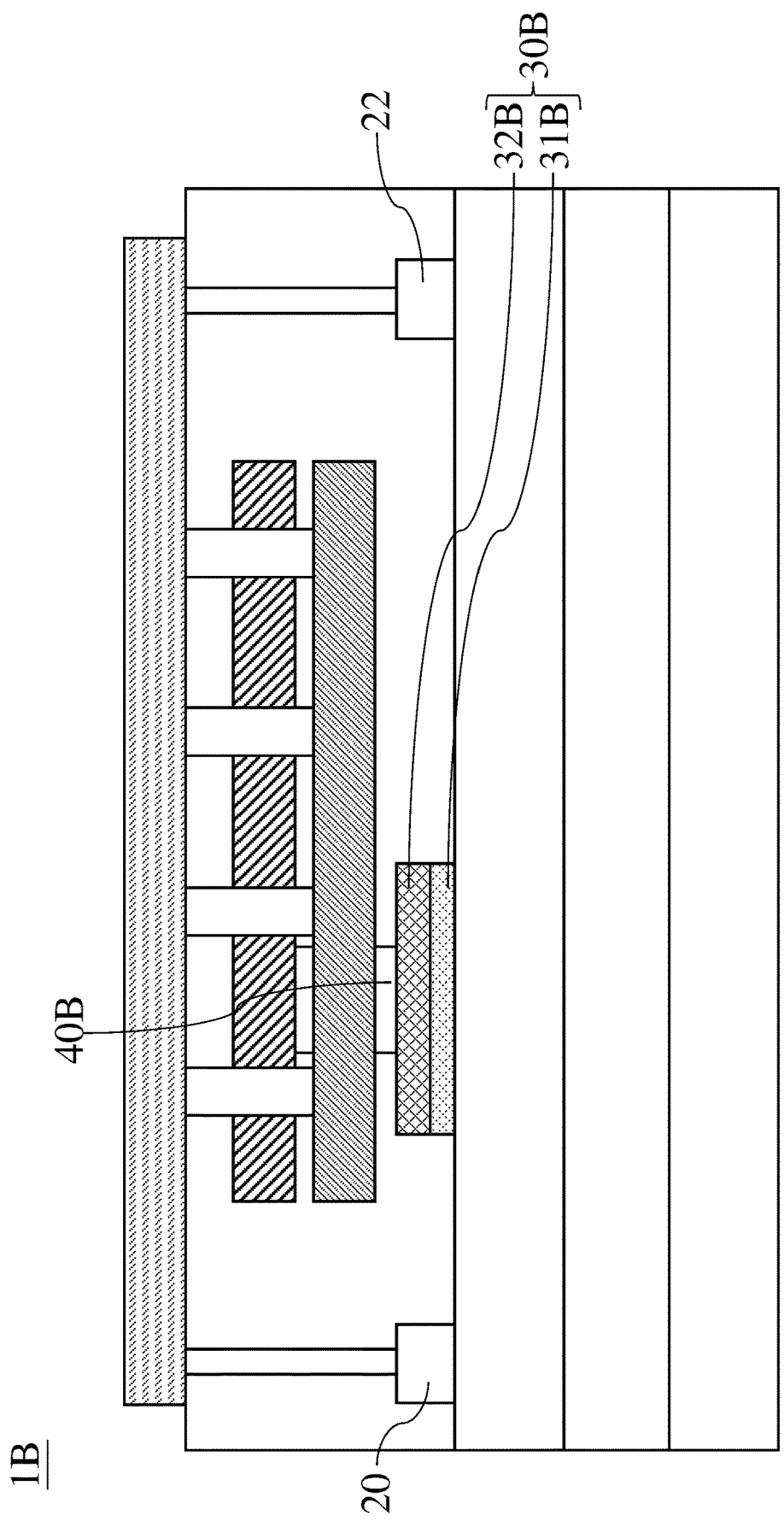
FIG. 2 is a side view of a semiconductor device according to some embodiments of the present disclosure.

FIG. 2 is a side view of a semiconductor device 1B according to some embodiments of the present disclosure. The semiconductor device 1B is similar to the semiconductor device 1A as described and illustrated with reference to FIGS. 1A-1E, except that the gate structure 30A is replaced by a gate structure 30B.

The gate structure 30A is located between the electrodes 20 and 22. In the present embodiment, the electrode 20 is closer to the gate structure 30A than the electrode 22. The gate structure 30B can include a doped nitride-based semiconductor layer 31B and a gate electrode 32B. The gate electrode 32B is located between the doped nitride-based semiconductor layer 31B and a gate contact 40B. In the present embodiment, the electrode 20 is closer to the gate contact 40B than the electrode 22. Such the asymmetrical configuration is advantageous to be applied to a high voltage device, and the electrical connection for constituting HEMT and MIM capacitors can be achieved still.

Figure 3:
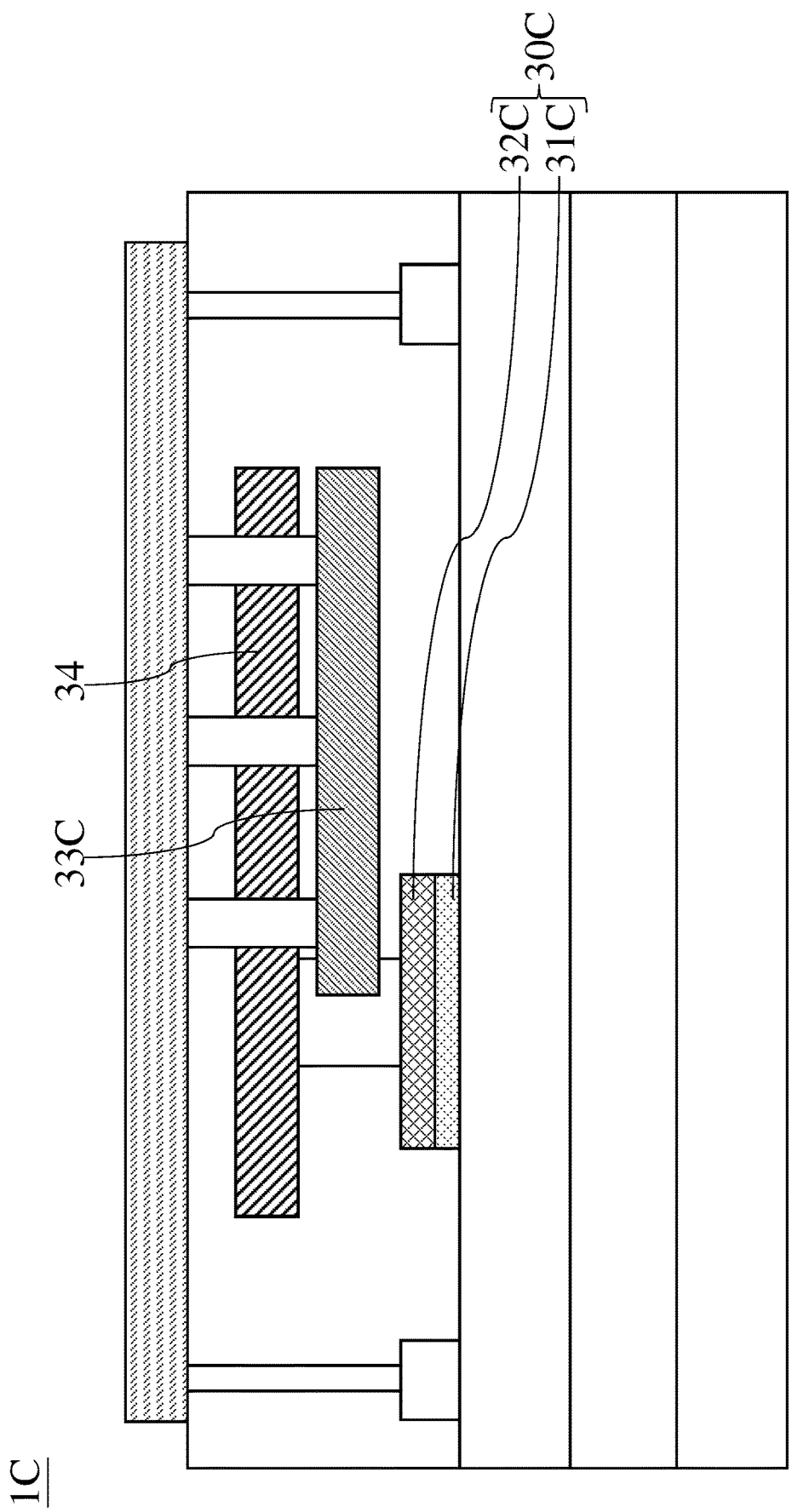
FIG. 3 is a side view of a semiconductor device according to some embodiments of the present disclosure.

FIG. 3 is a side view of a semiconductor device 1C according to some embodiments of the present disclosure. The semiconductor device 1C is similar to the semiconductor device 1A as described and illustrated with reference to FIGS. 1A-1E, except that the gate structure 30A and the field plate 33A are replaced by a gate structure 30C and a field plate 33C, respectively.

The gate structure 30C can include a doped nitride-based semiconductor layer 31C and a gate electrode 32C. The gate structure 30C can apply a configuration the same as the gate structure 30B as stated in FIG. 2. The field plate 33C has a width less than a width of the filed plate 34. The field plate 33C and the filed plate 34 overlap with each other over the gate structure 30C. Such the width configuration can be made based on the desired modulation to the electric field, and the electrical connection for constituting HEMT and MIM capacitors can be achieved still.

Figure 4:
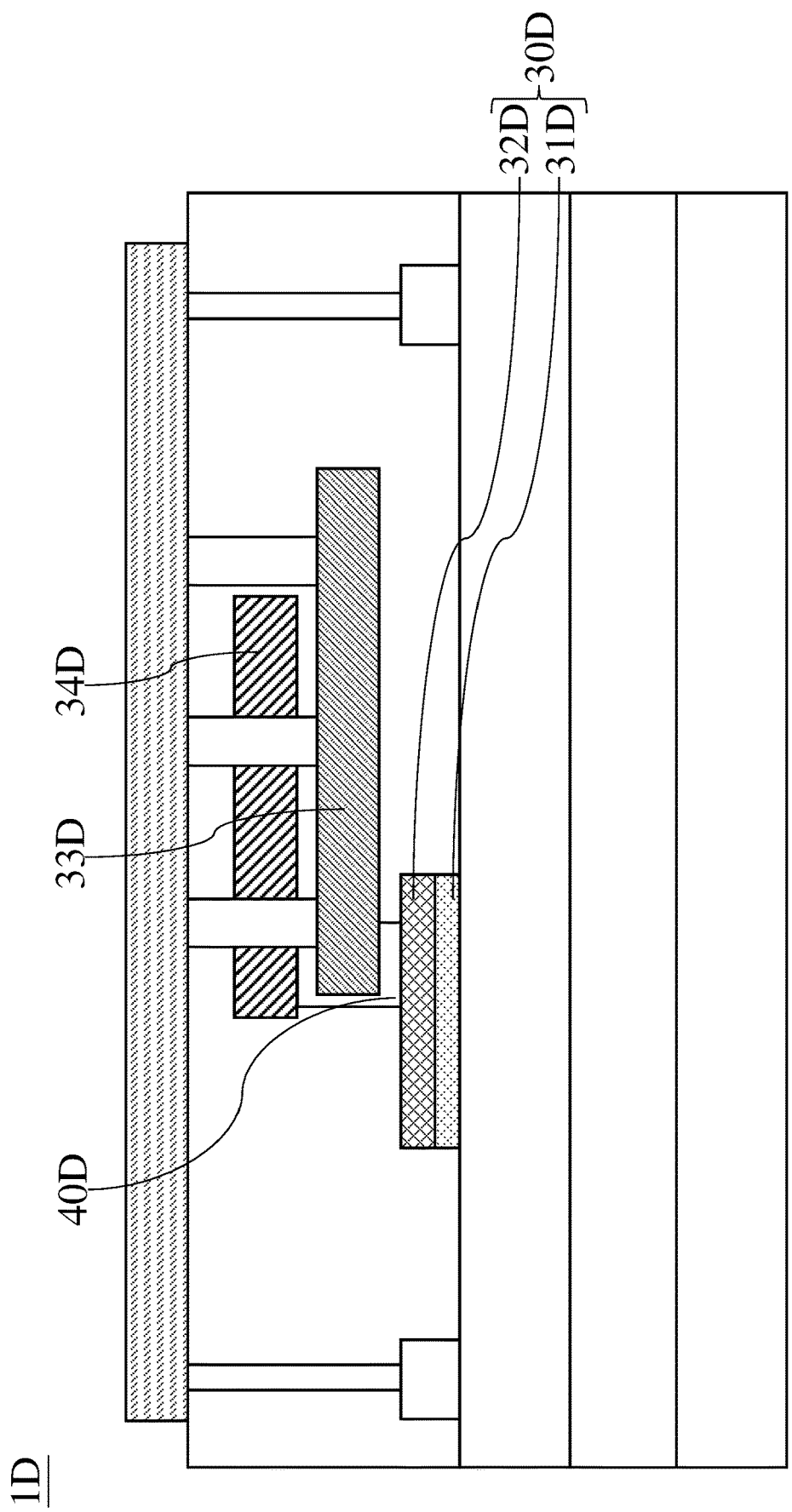
FIG. 4 is a side view of a semiconductor device according to some embodiments of the present disclosure.

FIG. 4 is a side view of a semiconductor device 1D according to some embodiments of the present disclosure. The semiconductor device 1D is similar to the semiconductor device 1A as described and illustrated with reference to FIGS. 1A-1E, except that the gate structure 30A and the field plate 33A and 34A are replaced by a gate structure 30D and field plates 33D and 34D, respectively.

The gate structure 30D can include a doped nitride-based semiconductor layer 31D and a gate electrode 32D. The gate structure 30D and the field plate 33D can apply a configuration the same as the gate structure 30C and the field plate 33C as stated in FIG. 3. The field plate 34D has an end portion directly over the gate structure 30D. At least one portion of the gate structure 30D is free from the coverage of the field plate 34D. A gate contact 40D extends between the gate structure 30D and the end portion of the field plate 33D to keep the electrical connection between the gate structure 30D and the field plate 34D. Such the configuration can be made based on the required capacitance of a MIM capacitor as well as the modulation to the electric field, and the electrical connection for constituting HEMT and MIM capacitors can be achieved still.

As described above, a HEMT capacitor and a MIM capacitor in parallel can be integrated into a semiconductor device, which is advantageous to improvement of space utilization. Accordingly, the capacitance per unit volume or per area in the semiconductor device increases. Such the electrical connection manner is highly compatible with HEMT devices, thereby adapting to HEMT devices.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device comprising,
a first nitride-based semiconductor layer;
a second nitride-based semiconductor layer disposed on the first nitride-based semiconductor layer and having a bandgap greater than a bandgap of the first nitride-based semiconductor layer;
a source electrode and a drain electrode disposed above the second nitride-based semiconductor layer;
a gate structure disposed above the second nitride-based semiconductor layer and located between the source electrode and the drain electrode;
a first field plate disposed over the gate structure and electrically coupled with the source electrode and the drain electrode; and
a second field plate disposed over the gate structure and electrically coupled with the gate structure, wherein the first field plate and the second field plate are parallel with each other, and a top surface of the first field plate faces a bottom surface of the second field plate to overlap with each other over the gate structure.

2. The nitride-based semiconductor device of claim 1, wherein the gate structure, the source electrode, and the drain electrode are arranged to overlap with an active region, wherein the top surface of the first field plate and the bottom surface of the second field plate overlap with each other over the active region.

3. The nitride-based semiconductor device of claim 1, further comprising:
a gate contact extending between the gate structure and the second field plate.

4. The nitride-based semiconductor device of claim 3, wherein the gate contact extends upward to make contact with the second field plate so as to form an interface with the second field plate in a position higher than the first field plate.

5. The nitride-based semiconductor device of claim 3, wherein the gate structure, the source electrode, and the drain electrode are arranged to overlap with an active region, and a vertical projection of the gate contact on the second nitride-based semiconductor layer is outside of the active region.

6. The nitride-based semiconductor device of claim 3, wherein the gate contact horizontally overlaps with the first field plate.

7. The nitride-based semiconductor device of claim 1, further comprising:
a conductive layer disposed over the second field plate, wherein the first field plate is electrically coupled with the source electrode and the drain electrode through the conductive layer.

8. The nitride-based semiconductor device of claim 7, wherein the second field plate is located between the first field plate and the conductive layer.

9. The nitride-based semiconductor device of claim 7, further comprising:
a plurality of first contact vias extending upward from the source electrode and the drain electrode to the conductive layer.

10. The nitride-based semiconductor device of claim 9, wherein the first contact vias extend upward to make contact with the conductive layer so as to form an interface with the conductive layer in a position higher than the second field plate.

11. The nitride-based semiconductor device of claim 9, further comprising:
a plurality of second contact vias extending upward from the first field plate to the conductive layer.

12. The nitride-based semiconductor device of claim 11, wherein the second contact vias horizontally overlaps with the second field plate.

13. The nitride-based semiconductor device of claim 1, wherein the first filed plate and the second field plate are located in a region between the source electrode and the drain electrode.

14. The nitride-based semiconductor device of claim 1, further comprising:
a dielectric material filling a region between the first field plate and the second field plate.

15. The nitride-based semiconductor device of claim 1, wherein the gate structure comprises:
a gate electrode; and a doped nitride-based semiconductor layer disposed between the second nitride-based semiconductor layer and the gate electrode.

16. A method for manufacturing a nitride-based semiconductor device, comprising:
    forming a second nitride-based semiconductor layer on a first nitride-based semiconductor layer;
    forming a source electrode, a drain electrode, and a gate structure over the second nitride-based semiconductor layer;
    forming a first field plate over the gate structure;
    forming a second field plate over the first field plate;
    connecting the gate structure and the second field plate; and
    electrically connecting the source electrode and the drain electrode to the first field plate.

17. The method of claim 16, wherein connecting the gate structure and the second field plate comprises:
    forming a gate contact prior of the formation of the second field plate, wherein the second field plate is formed to cover the gate contact.

18. The method of claim 16, wherein electrically connecting the source electrode and the drain electrode to the first field plate further comprises:
    forming a conductive layer over the second field plate such that the source electrode and the drain electrode are electrically connected to the first field plate through the conductive layer.

19. The method of claim 18, wherein electrically connecting the source electrode and the drain electrode to the first field plate further comprises:
    forming a plurality of first contact vias extending upward from the source electrode and the drain electrode to the conductive layer prior to the formation of the conductive layer.

20. The method of claim 19, wherein electrically connecting the source electrode and the drain electrode to the first field plate further comprises:
    forming a plurality of second contact vias extending upward from the first field plate to the conductive layer prior to the formation of the conductive layer.

* * * * *